United States Patent
Bucksch

(10) Patent No.: US 7,317,323 B2
(45) Date of Patent: Jan. 8, 2008

(54) SIGNAL TEST PROCEDURE FOR TESTING SEMI-CONDUCTOR COMPONENTS AND A TEST APPARATUS FOR TESTING SEMI-CONDUCTOR COMPONENTS

(75) Inventor: Thorsten Bucksch, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/948,741

(22) Filed: Sep. 24, 2004

(65) Prior Publication Data

US 2005/0093564 A1    May 5, 2005

(30) Foreign Application Priority Data

Sep. 25, 2003  (DE) ................................ 103 44 641

(51) Int. Cl.
*G01R 31/26* (2006.01)

(52) U.S. Cl. ................... 324/765; 324/73.1; 324/763

(58) Field of Classification Search .................... None
See application file for complete search history.

(56) References Cited

U.S. PATENT DOCUMENTS 3,772,595 A * 11/1973 De Wolf et al. ............ 714/736
3,976,940 A * 8/1976 Chau et al. ................. 714/736
6,657,452 B2 * 12/2003 Beer et al. .................. 324/765
6,747,470 B2 * 6/2004 Muhtaroglu et al. ........ 324/765
6,879,175 B2 * 4/2005 Conner ....................... 324/765
2002/0109524 A1  8/2002 Hartmann
2003/0046624 A1  3/2003 Muhtaroglu

FOREIGN PATENT DOCUMENTS

DE    101 07 180    9/2002

* cited by examiner

*Primary Examiner*—Minh N. Tang
(74) *Attorney, Agent, or Firm*—Slater & Matsil, L.L.P.

(57) ABSTRACT

The invention relates to a test apparatus for testing semi-conductor components, and to a signal testing procedure, to be used especially during the testing of semi-conductor components. A signal is applied to a connection of a semi-conductor component, a reference signal is applied at a particular voltage level to a further connection of the semi-conductor component, the signal is compared with the reference signal, the voltage level of the reference signal is changed, and the signal is compared with the reference signal.

19 Claims, 4 Drawing Sheets

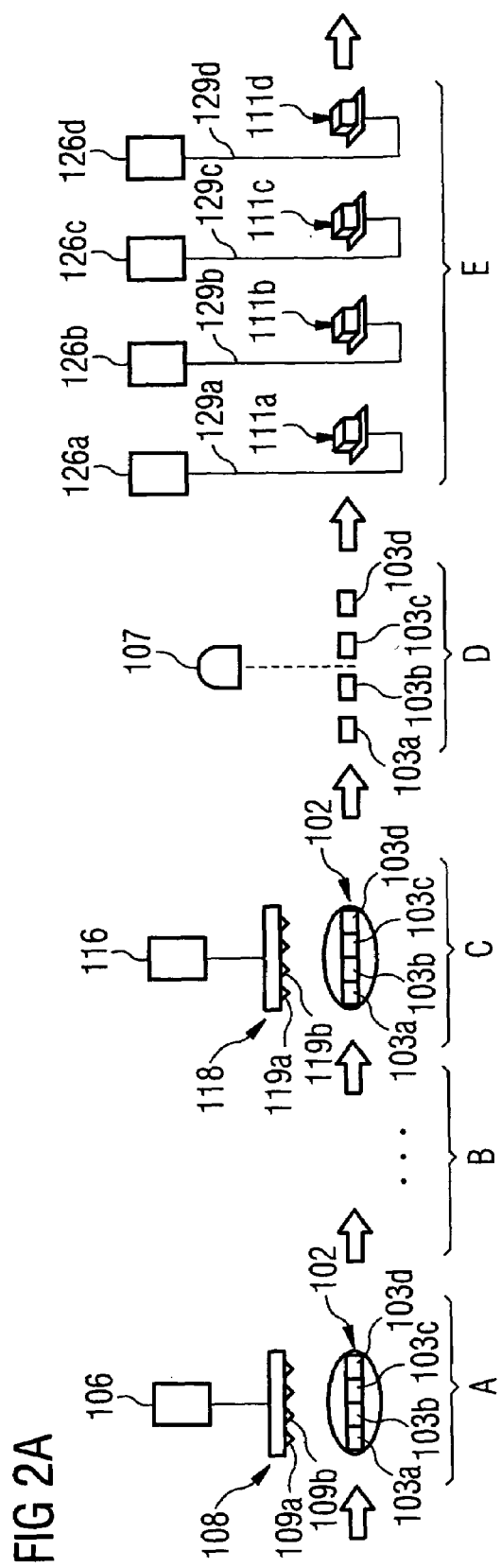
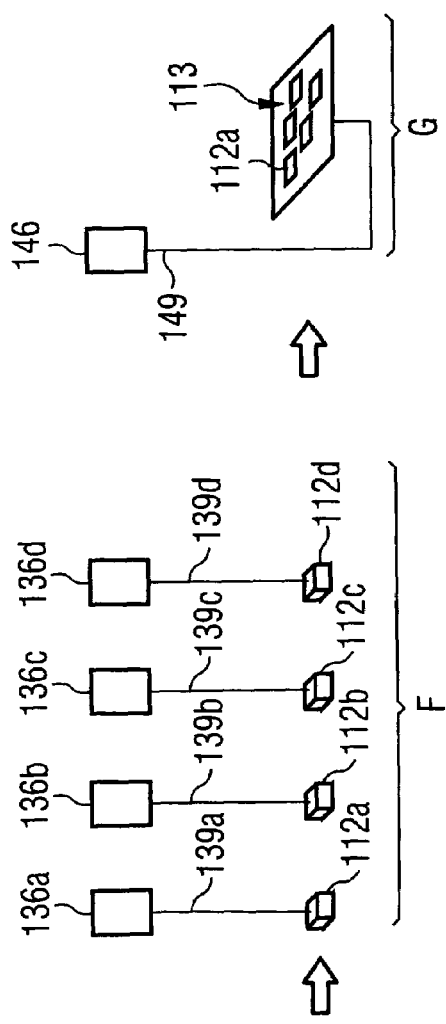
FIG 2A
FIG 2B

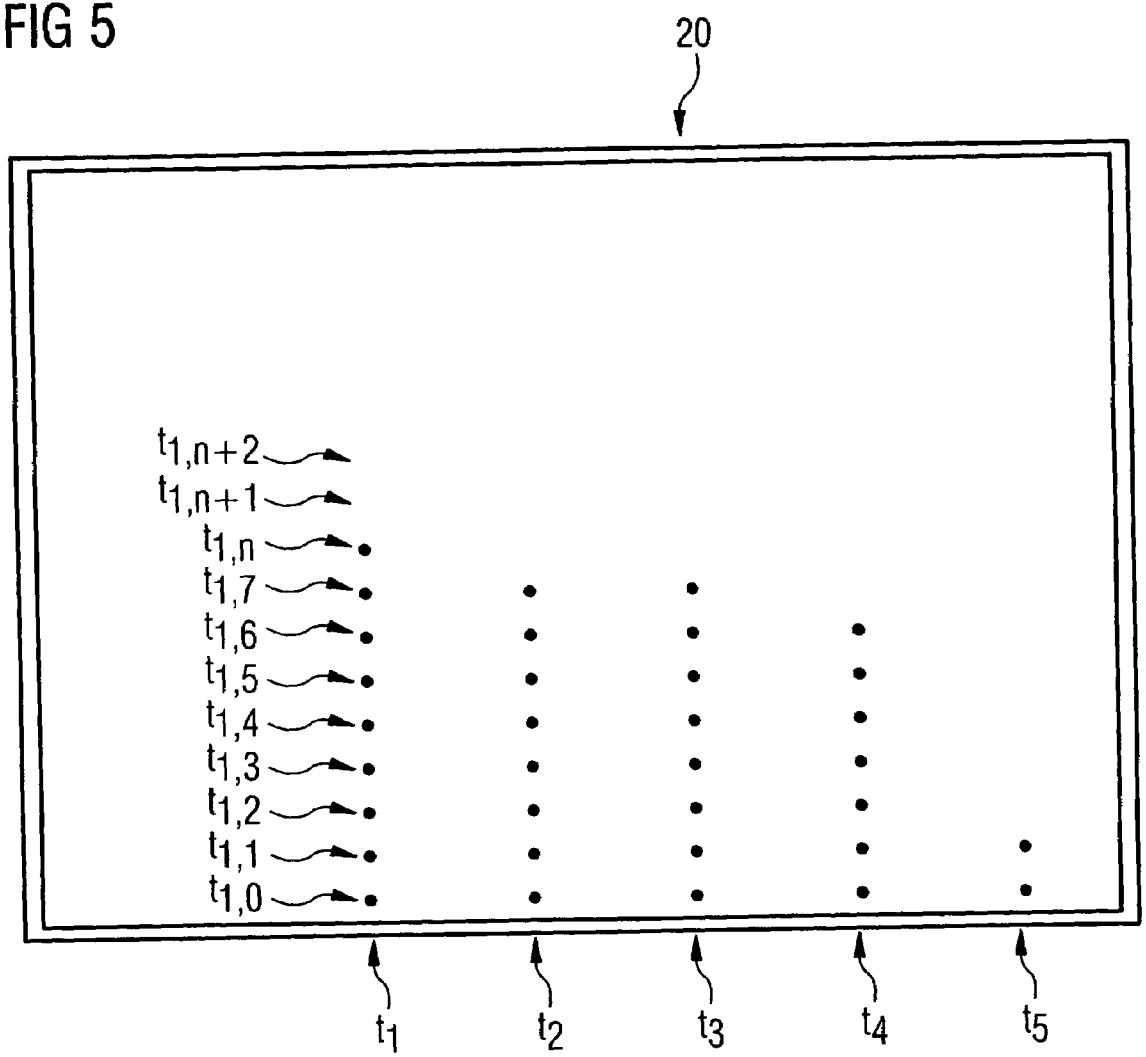

SIGNAL TEST PROCEDURE FOR TESTING SEMI-CONDUCTOR COMPONENTS AND A TEST APPARATUS FOR TESTING SEMI-CONDUCTOR COMPONENTS

CLAIM FOR PRIORITY

This application claims the benefit of priority to German Application No. 103 44 641.9, which was filed in the German language on Sep. 25, 2003, the contents of which are hereby incorporated by reference.

TECHNICAL FIELD OF THE INVENTION

The invention relates to a signal test procedure, in particular to be used for testing semi-conductor components, and to a test apparatus for testing semi-conductor components.

BACKGROUND OF THE INVENTION

Semi-conductor components, for instance corresponding integrated (analog and/or digital) computer circuits, semi-conductor memory components, for instance functional memory components (PLAs, PALs, etc.) and table memory components (e.g. ROMs or RAMs, in particular SRAMs and DRAMs) are subjected to extensive testing during the manufacturing process.

For the simultaneous combined manufacture of numerous (generally identical) semi-conductor components, a so-called wafer (i.e. a thin disk of monocrystalline silicon) is used. The wafer is appropriately treated (for instance subjected in succession to numerous coating, exposure, etching, diffusion and implantation process steps, etc.), and then for instance sliced up (or scored and snapped off), so that the individual components become available.

During the manufacture of semi-conductor components (for instance DRAMs (Dynamic Random Access Memories and/or dynamic read-write memories), in particular of DDR-DRAMs (Double Data Rate-DRAMs and/or DRAMs with double data rate)) semi-completed components (still on the wafer) can be subjected—even before the above process steps required for the wafer have been completed (i.e. even while the semi-conductor components are still in a semi-complete state)—to appropriate test processes at one or more test stations (for instance so-called kerf measurements at the wafer scoring frame) with the aid of one or more test apparatuses.

After completion (i.e. after completion of all the above wafer processing steps) the semi-conductor components are subjected to further test procedures at one or more (further) test stations. For instance, completed components—still present on the wafer—can be appropriately tested with the aid of corresponding (additional) test equipment ("slice tests").

After the wafers have been sliced up (and/or scored and snapped off) the—individually available components—are next each loaded into a so-called carrier (i.e. a suitable mounting), whereupon the semi-conductor components—loaded into the carrier—can be subjected to one or several (further) test procedures corresponding with other test stations.

In the same way, one or more further tests (at corresponding test stations and with the use of appropriate additional test equipment) can be performed, for instance after the semi-conductor components have been mounted onto the corresponding semi-conductor component housing, and/or for instance after the semi-conductor component housing (together with the semi-conductor components mounted onto it in each case) has been mounted (for so-called module tests) into a corresponding electronic module.

In testing the semi-conductor components, (for instance with the above slice tests, module tests, etc.) so-called "DC tests" and/or for instance so-called "AC tests" may in each case be applied.

For a DC test for instance, a particular voltage (or current)—in particular one remaining at a particular fixed level—can be applied to the appropriate connection of a semi-conductor component to be tested, whereafter the level of the—resulting—current (and/or voltage) can be measured by the test apparatus, in particular to ascertain whether these currents (and/or voltages) fall within certain predetermined desired critical limits.

During an AC test in contrast, voltages (or currents)—at varying levels—can for instance be applied to the appropriate connections of a semi-conductor component by the test apparatus as test signals, in particular as appropriate test sample signals with the aid of which appropriate function tests can be performed on each semi-conductor component.

With the help of the above test procedures, defective semi-conductor components can be identified and removed (or to a certain extent even repaired).

In so doing it must be ensured—especially when using high-frequency (AC) test signals—that the signals emitted by each test apparatus and applied to each semi-conductor component connection by means of a corresponding test line, are not (too severely) corrupted, for instance by reflections or noise resulting from signal distortions etc. caused by contact inductivity; in other words, that the quality of the test signals satisfy the requirements in each case.

Testing the signal quality of the test signal present at each semi-conductor component connection is a difficult process.

When the test signal, emitted by each test apparatus for assessing signal quality and present at each semi-conductor component connection, is for instance fed to an appropriate signal measuring apparatus by means of an additional external test line (or for instance fed back to the test apparatus), the electrical characteristics of the semi-conductor component connection are changed by the—additional—test line (and the apparatus connected to it), whereby the test signal to be measured and/or assessed is distorted.

SUMMARY OF THE INVENTION

This invention discloses a novel signal testing procedure, in particular one to be used for testing semi-conductor components, as well as a novel test apparatus for testing semi-conductor components.

In embodiment of the invention, a signal testing procedure is made available, to be used especially for testing semi-conductor components, including:

a) Applying a signal ($U_e$), of which the quality is to be tested, to a connection of a semi-conductor component, wherein the procedure includes:

b) Applying a reference signal ($V_{interface,external}$) at a particular voltage level to a further connection of the semi-conductor component;

c) Comparing the signal ($U_e$) with the reference signal ($V_{interface,external}$);

d) Changing the voltage level of the reference signal ($V_{interface,external}$); and e) Again comparing the signal ($U_e$) with the reference signal ($V_{interface,external}$).

In addition, the procedure may advantageously include:

f) Changing the voltage level of the reference signal ($V_{interface,external}$) to one which differs from the reference signal voltage level used in b) and d);

g) Again comparing the signal ($U_e$) with the reference signal ($V_{interface,external}$).

Advantageously, when comparing the signal ($U_e$) with the reference signal ($V_{interface,external}$) it is determined whether the reference signal voltage level is higher or lower than the voltage level of the signal ($U_e$).

Advantageously—especially in the case where the voltage of the signal ($U_e$) at first remains at an essentially constant level—a multitude of further process steps corresponding with d) and e) and/or f) and g) are performed.

Then, correspondingly, when the state of the signal ($U_e$) at the connection of the semi-conductor component has changed—possibly several times—(i.e. with changed voltage levels of the signal ($U_e$)), d) and e) and/or f) and g) are performed, etc.

In this way, the signal progression of the signal ($U_e$) present at the above connection of the semi-conductor component can be precisely detected and/or measured, without the electrical characteristics of the semi-conductor component connections being modified by the measurement, which effect can falsify the signal ($U_e$) to be measured and/or assessed.

BRIEF DESCRIPTION OF THE DRAWINGS

Below the invention is more closely described with by use of an embodiment example and the attached illustration. In the illustration:

FIG. 2a shows the stations that are passed through during the manufacture of corresponding semi-conductor components, and of several further test apparatuses provided at each of the stations.

FIG. 2b shows further stations passed through during the manufacture of corresponding semi-conductor components, and of several further test apparatuses provided at the further test stations.

FIG. 5 shows a video screen on which the results of the signal-test procedure can be visualized.

DETAILED DESCRIPTION OF THE INVENTION

Figure 1:
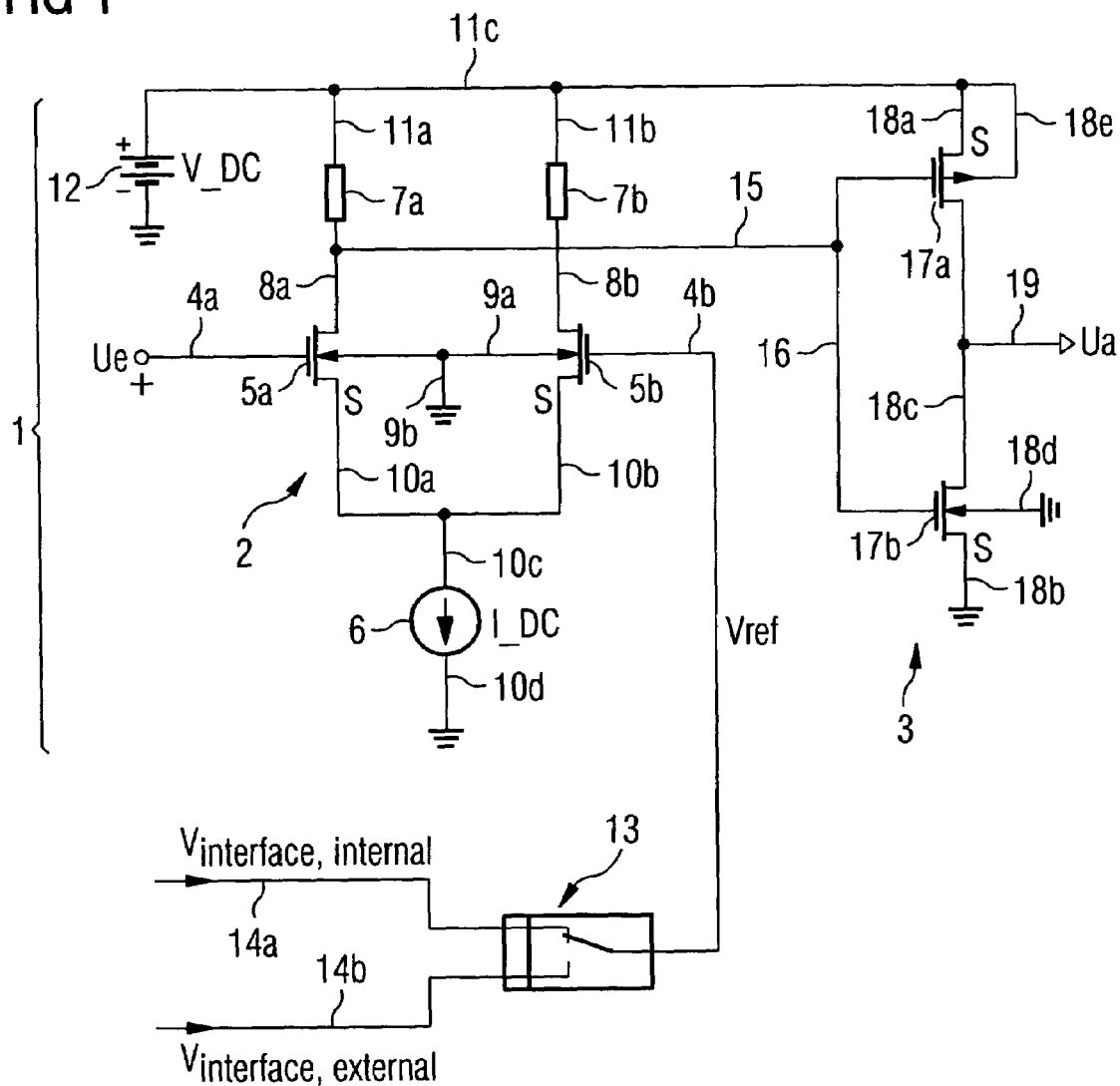
FIG. 1 shows a switching device, installed on a semi-conductor component, for performing a signal test procedure according to an embodiment example of the invention.

In FIGS. 2a and 2b, some of the stations A, B, C, D, E, F, G (of several further stations not shown here) passed through by the corresponding semi-conductor components 103a, 103b, 103c, 103d during the manufacture of the semi-conductor components 103a, 103b, 103c, 103d (and/or electronic modules) are—schematically—shown.

The semi-conductor components 103a, 103b, 103c, 103d may for instance be corresponding integrated (analog and/or digital) computer circuits, and/or semi-conductor memory components, for instance functional memory components (i.e. PLAs, PALs, etc.), and table memory components, (for instance ROMs or RAMs), in particular SRAMs or DRAMs (here for instance DRAMs (Dynamic Random Access Memories and/or Dynamic Read-Write Memories) with double data rate (DDR DRAMs=Double Data Rate-DRAMs), preferably high-speed DDR DRAMs).

During the manufacture of the semi-conductor components 103a, 103b, 103c, 103d, an appropriate silicon disk or an appropriate wafer 102 is subjected to corresponding conventional coating, exposure, etching, diffusion, and/or implantation process steps, etc.—for instance at the corresponding stations placed in series upstream and downstream from the station A shown in FIG. 2a (for instance, station B placed after station A—as well as numerous further stations—not shown here—(placed before and after station A)).

Station A serves to subject the semi-conductor components 103a, 103b, 103c, 103d—still present on wafer 102—to one or more test procedures, for instance the so-called kerf measurements at the wafer scoring frame—(in fact—as is apparent from the embodiments above—even before all the above process steps required for wafer 102 have been completed (i.e. already during the semi-completed state of the semi-conductor components 103a, 103b, 103c, 103d)).

From station A, wafer 102 is (in particular fully automatically) transported to station B (and from there possibly to numerous further stations not shown here), where—as already mentioned above—wafer 102 is subjected to further appropriate process steps (in particular to corresponding coating, exposure, etching, diffusion, and/or implantation process steps, etc.), and/or to further test procedures—correspondingly similar to those applied at station A.

After the semi-conductor components have been completed (i.e. after all the above wafer processing steps have been performed) wafer 102 is transported from the corresponding—previous—processing station (for instance from station B, or other further—downstream—stations)—in particular completely automatically—to the next station C.

Station C serves to subject the semi-conductor components 103a, 103b, 103c, 103d—completed and still present on wafer 102 to—one or more—further test procedures (for instance so-called slice tests) by means of a test apparatus 116.

The voltages/currents and/or test signals required at station C for testing the semi-conductor components 103a, 103b, 103c, 103d on the wafer 102, are generated by test apparatus 116, and fed by means of a semi-conductor component test card 118, connected to the test apparatus 116, to the corresponding connections of the semi-conductor components 103a, 103b, 103c, 103d (more precisely: by means of corresponding contact pins 119a, 119b provided on test card 118).

From station C wafer 102 is (in particular fully automatically) transported to the next station D, where (after wafer 102 has had foil glued to it in recognized fashion) it is sliced up by means of an appropriate machine 107 (or for instance scored and snapped off), so that the semi-conductor components 103a, 103b, 103c, 103d then become—individually—available.

Before being transported to station D, wafer 102—and/or the components 103a, 103b 103c, 103d present on it—may be subjected to one or more further test procedures at one or several stations corresponding with station C.

After wafer 102 has been sliced up at station D, each individual component 103a, 103b, 103c, 103d is then (in particular—again—fully automatically) loaded into an appropriate carrier 111a, 111b, 111c, 111d and/or holder 111a, 111b, 111c, 111d, whereafter the semi-conductor components 103a, 103b, 103c, 103d—loaded into carriers 111a, 111b, 111c, 111d—are transported to one or several (further) test stations—for instance to the station E shown in FIG. 2a—and subjected to one or more further test procedures (for instance to so-called carrier tests).

For this, the carriers 111a, 111b, 111c, 111d are inserted into a corresponding carrier socket and/or carrier adapters and/or sockets, which are connected via corresponding lines 129a, 129b, 129c, 129d, to one (or more) corresponding test apparatus(es) 126a, 126b, 126c, 126d.

The voltages/currents and/or test signals required at station E for testing the semi-conductor components 103a, 103b, 103c, 103d in the carriers 111a, 111b, 111c, 111d, are generated by the test apparatus(es) 126a, 126b, 126c, 126d, and fed to corresponding connections on the semi-conductor components 103a, 103b, 103c, 103d via the carrier socket connected by the lines 129a, 129b, 129c, 129d to the test apparatus(es) 126a, 126b, 126c, 126d, and to the carriers 111a, 111b, 111c, 111d connected to them.

From station E the semi-conductor components 103a, 103b, 103c, 103d are further transported (in particular fully automatically) to one or more station(s)—not shown here—where the semi-conductor components 103a, 103b, 103c, 103d are mounted into the corresponding housings 112a, 112b, 112c, 112d (for instance corresponding plug-in or surface-mounted component housings, etc.).

As shown in FIG. 2b the semi-conductor components 103a, 103b, 103c, 103d—mounted into housings 112a, 112b, 112c, 112d—are then further transported to one (or more) further test stations—for instance to the station F shown in FIG. 2b—and subjected to one or more further test procedures there.

For this, the semi-conductor component housings 112a, 112b, 112c, 112d are inserted into corresponding component housing sockets and/or component housing adapters connected—via corresponding lines 139a, 139b, 139c, 139d—to one (or more) corresponding test apparatus(es) 136a, 136b, 136c, 136d.

The voltages/currents and/or test signals required at station F for testing the semi-conductor components 103a, 103b, 103c, 103d—mounted in the housings 112a, 112b, 112c, 112d—are generated by the test apparatus(es) 136a, 136b, 136c, 136d and fed via the lines 139a, 139b, 139c, 139d connected to the housing sockets and the test apparatus (es) 136a, 136b, 136c, 136d, and the component housings 112a, 112b, 112c, 112d connected to them, to corresponding connections on the semi-conductor components 103a, 103b, 103c, 103d.

From station F the semi-conductor components 103a, 103b, 103c, 103d mounted in the housings 112a, 112b, 112c, 112d can then—optionally—be transported to one or more further station(s)—not shown here—where a corresponding semi-conductor component housing (for instance the housing 112a, with the semi-conductor component 103a mounted in it)—together with further components (analog and/or digital computer circuits, and/or semi-conductor memory components, for instance PLAs, PALs, ROMs, RAMS, in particular SRAMs or DRAMs, etc.)—is connected to a corresponding electronic module 113, for instance a circuit board.

As shown in FIG. 2b, the electronic module 113 (and thereby also the semi-conductor components 103a (mounted in a corresponding housing 112a)—connected to the electronic module 113)) can then—optionally—be transported further to one (or more) further test stations—for instance the station G shown in FIG. 2b—and there be subjected to one or more further test procedures (in particular to the so-called module tests).

The voltages/currents and/or test signals required at station G for testing the module 113 (and thereby also the semi-conductor component 103a mounted in it) are for instance generated by a test apparatus 146, and fed via a line 149 to the electronic module 113, and thereby also to the corresponding connections of the corresponding semi-conductor components 103a mounted on it.

The above test procedures used for testing the semi-conductor components 103a, 103b, 103c, 103d (for instance at station A, and/or station C, and/or station E, and/or station F, and/or station G, and/or further stations not shown here) and/or corresponding further test procedures performed by the test apparatuses 106 and/or 116, and/or the test apparatuses 126a, 126b, 126c, 126d and/or 136a, 136b, 136c, 136d, and/or the test apparatus 146, and/or by other test apparatuses—not shown here—(kerf measurements, slice tests, carrier tests, module tests, etc.)—may in each case involve the so-called DC tests, and/or for instance the so-called AC tests.

With the help of the above test procedures, defective semi-conductor components can be identified and removed (or to a certain extent possibly even repaired).

In so doing it should be ensured—especially when using high-frequency (AC) test signals—that the signals emitted by each of the test apparatuses 106, 116, 126a, 126b, 126c 126d, 136a 136b 136c, 136d and applied to a corresponding connection on each of the semi-conductor components 103a, 103b, 103c by means of a corresponding test line, are not corrupted (too severely), for instance by reflections and/or noise due to signal distortions etc. caused by contact inductivity, in other words that the quality of the test signals satisfies the requirements in each case.

FIG. 1 shows a schematic representation of a switching device installed on one of the semi-conductor components 103a, 103b, 103c shown in FIGS. 2a and 2b, for performing a signal test procedure, in particular a procedure for assessing the signal quality of the test signal present at the semi-conductor component connection in question.

The switching device contains a signal receiver switching section 1, constructed similarly to conventional signal receiver switching sections from conventional semi-conductor components, and one which in the present embodiment example contains a reference circuit 2 and signal relay circuit 3.

A first input of the reference circuit 2 is connected via a line 4a to an external connection of the semi-conductor components 103a, 103b, 103c (for instance to a corresponding pad of the semi-conductor components 103a, 103b, 103c).

During the later normal operation of the semi-conductor components 103a, 103b, 103c, a conventional input signal (voltage $U_e$), for instance one to be appropriately processed by the semi-conductor component 103a, 103b, 103c, is applied to this connection, or, during a test operation of the semi-conductor components, a conventional test signal (voltage $U_e$), of which the quality can be assessed with the help of the signal-test procedure described here and which is made available by a corresponding test apparatus (for instance by one of the above test apparatuses 106, 116, 126a, 126b, 126c, 126d, 136a, 136b, 136c, 136d, 146), is applied.

The reference circuit 2 includes two transistors 5a, 5b (here: two n-channel MOSFETs 5a, 5b)—connected in parallel—as well as a (constant) current source device 6,—connected in series with the n-channel MOSFETs 5a, 5b—and two resistors 7a, 7b, each connected in series with one of the corresponding two n-channel MOSFETs 5a, 5b.

As is further apparent from FIG. 1, the above semi-conductor component connection (and/or the above semi-conductor component pad) is connected—via the above line 4a—to a gate of the n-channel MOSFET 5a (i.e. to the first input of the reference circuit 2).

The drain of the n-channel MOSFET 5a is connected to the above resistor 7a—allocated to the n-channel MOSFET—via a line 8a.

In corresponding fashion the drain of the—second—n-channel MOSFET 5b is also connected to the corresponding resistor 7b allocated to it (and in fact via a line 8b).

The resistor 7a is connected—via a line 11a—and the resistor 7b—via a line 11b—to a line 11c, which is connected to a plus input of a direct current voltage source device 12, which provides a direct current voltage V_DC at a particular level, for instance V_DC=1.8 V, obtained for instance from an external supply voltage.

As is further apparent from FIG. 1, the bulk connections of both the n-channel MOSFET 5a, 5b are interconnected via a line 9a, and connected to the earth potential via line 9b connected to line 9a.

The source of the n-channel MOSFET 5a is connected via a line 10a, and a line 10c connected to it, to the current source device 6.

In similar fashion, the source of the n-channel MOSFET 5b is also connected to the current source device 6 (in fact, via a line 10b, and the line 10c connected to it).

The current source device 6 is connected—via a line 10d—to the earth potential.

The gate of the n-channel MOSFET 5b (i.e. the second input of reference circuit 2) is connected via a line 4b—as is more closely described below—to a switching device 13, with which—optionally—(and for instance depending on a control signal made available by any test apparatus and fed to the control input (not shown here) of the switching device 13) electrical contact can be established between either line 4b and a line 14b, or between line 4b and a line 14a.

During the normal operation of the semi-conductor components 103a, 103b, 103b—in accordance with the state of the switching device 13 illustrated in FIG. 1—line 4b (and thereby also the second input of the reference circuit 2) is electrically connected to line 14a via the switching device 13 (and line 4b is electrically disconnected from line 14b).

A direct current voltage at a particular level—for instance DC voltage $V_{interface,internal}$, for instance $V_{interface,internal}$=0.9 V, obtained from the above external supply voltage, is present at the line 14a (which voltage is relayed—during the normal operation of the semi-conductor components—via switching device 13 and the line 4b, to the above second input of the reference circuit 2, where it is used as the reference voltage Vref, to be compared with the voltage $U_e$ present at the first input of the reference circuit).

The level of the voltage $V_{interface,internal}$ present at line 14a is lower, for instance about half as high as the level of the voltage V_DC, made available by the DC voltage source 12 and present at the above line 11c.

During the test operation of the semi-conductor components 103a, 103b, 103c the switching device 13 is switched over from the state illustrated in FIG. 1 to a state in which line 4b (and thereby the second input the reference circuit 2) is electrically connected to line 14b—via the switching device 13—and line 4b is electrically disconnected from line 14a—for instance by means of a corresponding control signal, fed by any one of the test apparatuses 106, 116, 126a, 126b, 126c, 126d, 136a, 136b, 136c, 136d, 146 to the above control input of the switching device 13—not shown here.

Line 14b is connected to a further external connection of the semi-conductor components 103a, 103b, 103c (and/or to a further semi-conductor component pad).

Figure 4:
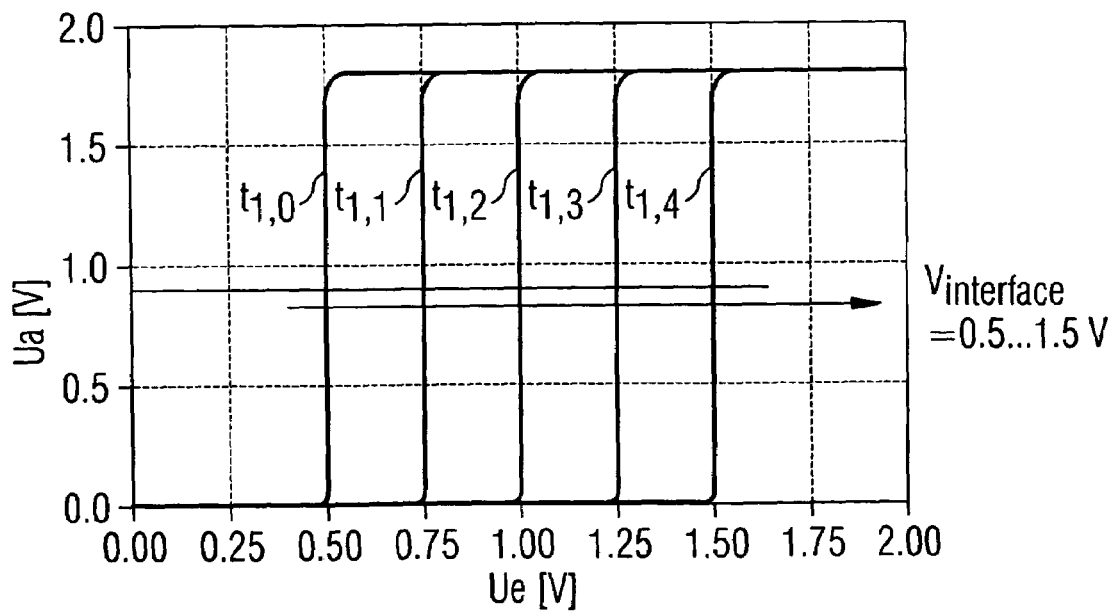
FIG. 4 shows the resulting signal detected while performing the signal test procedure, at various voltage levels of the signal to be tested, and various voltage levels of the reference signal.

At line 14b, as is more closely described below, a voltage $V_{interface,external}$—provided by the above test apparatus 106, 116, 126a, 126b, 126c, 126d, 136a, 136b, 136c, 136d, 146 (or alternatively for instance by a further separate measuring apparatus)—at a particular level $V_{interface,external}$ that is purposely varied during the course of the signal-test procedure is applied (for instance—as illustrated in FIG. 4—a voltage at a level varying between $V_{interface,external}$=0.5 V and $V_{interface,external}$=1.5 V (for instance initially $V_{interface,external}$=0.50 V, then $V_{interface,external}$=0.55 V, then $V_{interface,external}$=0.60 V, etc., etc.)).

The voltage $V_{interface,external}$ present at line 14b is relayed—during the test procedure of the semi-conductor components 103a, 103b, 103c, and according to the embodiments below—via the switching device 13 and line 4b, to the above second input of the reference circuit 2, where it is then used as the reference voltage Vref, to be compared with the voltage $U_e$ present at the first input the reference circuit 2.

As is further illustrated in FIG. 1, the line 8a, connected to the drain of the n-channel MOSFET 5a, (and thereby to the (first) output of the reference circuit 2) is connected via a line 15 to a line 16—connected to corresponding transistors 17a, 17b—(here: a p-channel MOSFET 17a, and an n-channel MOSFET 17b provided in the relay switch 3)(and thereby to the input of the signal relay switch 3).

Line 16 is connected to the gate of the n-channel MOSFET 17b and to the gate of the p-channel MOSFET 17a.

The source of the n-channel MOSFET 17b is connected to earth potential via a line 18b and the drain of the n-channel MOSFET 17b—via a line 18c—to the drain of the p-channel MOSFET 17a.

The bulk connection of the n-channel MOSFET 17b is connected to earth potential via a line 18d.

As further shown in FIG. 1, the source of the p-channel MOSFET 17a (and thereby also the bulk connection of the p-channel MOSFET 17a (in fact via a line 18e)) is connected via a line 18a to the above line 11c (and thereby to the above DC voltage source device 12).

Line 18c—connected to the drains of the n- and p-channel MOSFETs 17b, 17a (and thereby also to the output of the signal relay switch 3)—is connected to a line 19 with which the signal (voltage $U_a$), emitted by the signal relay circuit 3 (and/or by the output signal receiver circuit section 1) onto line 18c—for further processing—is relayed to other corresponding circuits—not shown here—installed in the semi-conductor component.

During the normal operation of the semi-conductor components 103a, 103b, 103c, the input signal (voltage $U_e$) present on the above line 4a (i.e. at the input of the signal receiver circuit section 1 and/or at the (first) input of the reference circuit 2) is compared—by means of the reference circuit 2 as described above during the normal operation of the semi-conductor components 103a, 103b, 103c—with the voltage $V_{interface,internal}$ present on line 14a and relayed via the switching device 13 to the (second) input of the reference circuit 2.

Depending on whether the voltage $U_e$ is higher or lower than the voltage $V_{interface,internal}$—used as the reference voltage Vref—an output signal at a relatively high, or a relatively low level is emitted at output of the reference circuit 2 (i.e. to the above line 8a, and thereby also to line 15 connected to the signal relay circuit 3), whereby the level of the output signal emitted on lines 8a, 15 is higher and/or lower, in accordance with the differential between the voltages $U_e$ and Vref (and/or $V_{interface,internal}$) being compared with each other by the reference circuit 2.

As already described above, the output signal emitted by the reference circuit 2 to line 8a—via line 15—is fed to the input of the signal relay circuit 3.

Depending on whether the level of the output signal fed by the reference circuit 2 to lines 8a, 15 (and fed—via line 16—to the gates of the transistors 17a, 17b of the signal relay circuit 3) is higher or lower than a predetermined critical value, a "high logic" or a "low logic" output signal (voltage $U_a$) is emitted at the output of the signal relay circuit 3 (i.e. to lines 18c, 19), because—depending on whether the output signal of the reference circuit 2, fed to the gates of transistors 17a, 17b, is higher or lower than the predetermined critical value—either the n-channel MOSFET 17b is brought into a conductive state, and the p-channel MOSFET 17a into a blocked state, or—conversely—the n-channel MOSFET 17b is brought into a blocked state and the p-channel MOSFET 17a into a conductive state.

Thereby it is ensured that the output signal (voltage $U_a$) emitted at the output the signal relay circuit 3 (and inverted in relation to the signal present at the input of the signal relay circuit 3) in every case "clearly" carries either a "high logic", or a "low logic" signal level (and not for instance—as may be the case with the output signal 2 emitted by the reference circuit 2—a level somewhere between a "high logic" and a "low logic" level).

As already described above, a test signal (voltage $U_e$) made available by a corresponding test apparatus 106, 116, 126a, 126b, 126c, 126d, 136a, 136b, 136c, 136d, 146 (and/or by a corresponding signal generating device of each test apparatus 106, 116, 126a, 126b, 126c, 126d, 136a, 136b, 136c, 136d, 146), of which the quality can be assessed with the aid of the signal test procedure described here, is applied—during the test operation of the semi-conductor components 103a, 103b, 103c—to the connection of the semi-conductor components 103a, 103b, 103c, which is connected to line 4a.

Furthermore—during the test operation of the semi-conductor components 103a, 103b, 103c—the signal ($V_{interface,external}$) used in the above signal-test procedure as reference signal, is fed to the further external connection of the semi-conductor components 103a, 103b, 103c (for instance—also—of the above test apparatuses 106, 116, 126a, 126b, 126c, 126d, 136a, 136b, 136c, 136d, 146 (and/or a corresponding further test apparatus signal generating device)) connected to line 14b, or—alternatively—for instance of the additionally provided separate measuring apparatus already mentioned above), and in fact—as also briefly mentioned above—a signal at a particular voltage level $V_{interface,external}$ which is deliberately varied during the execution of the signal-test procedure (for instance—as illustrated in FIG. 4—a voltage at levels varying between $V_{interface,external}$=0.5 V and $V_{interface,external}$=1.5 V).

For instance the corresponding test apparatus may first apply a voltage $V_{interface,external}$=0.50 V to the above connection (and as for instance illustrated in FIGS. 3 and 4, for instance at a point in time $t_{1,0}$), and (and as also illustrated for instance in FIGS. 3 and 4 for instance at a point in time $t_{1,1}$) then later a voltage $V_{interface,external}$=0.75 V (for instance at a point in time $t_{1,2}$) a voltage $V_{interface,external}$=1.00 V, followed (for instance at a point in time $t_{1,3}$) by a voltage $V_{interface,external}$=1.25 V, and finally (for instance at a point in time $t_{1,4}$) a $V_{interface,external}$=1.50 V), i.e. the level of the voltage $V_{interface,external}$ is every time for instance varied at chronologically equidistant points $t_{1,0}$, $t_{1,1}$, $t_{1,2}$, $t_{1,3}$, $t_{1,4}$ etc. (for instance in each case increased (or decreased)), and in fact for instance in essentially equal increments (for instance by 0.25V in each case, or—advantageously—by lesser amounts, for instance each less than 0.2V, 0.1V, or 0.05V, etc.).

At each of the above points $t_{1,0}$, $t_{1,1}$, $t_{1,2}$, $t_{1,3}$, $t_{1,4}$—as described above during the normal operation of the semi-conductor components 103a, 103b, 103c—the reference circuit 2 compares the level of the voltage $U_e$—present at line 4a (i.e. at the first input of the reference circuit 2)—with the voltage $V_{interface,external}$ correspondingly relayed via the switching device 13 during the test operation described above, to the (second) input of the reference circuit 2 (i.e. the line 4b).

Depending on whether the voltage $U_e$ is larger or smaller than the voltage $V_{interface,external}$—then used as reference voltage Vref—an output signal at a relatively high or at a relatively low level is emitted at the output of the reference circuit 2 (i.e. at the above line 8a, and thereby also to line 15, connected to the signal relay circuit 3) (whereby the level of the output signal emitted onto the lines 8a, 15 is larger or smaller in accordance with the differential between the voltages $U_e$ and Vref (and/or $V_{interface,internal}$) that have been compared with each other by the reference circuit 2.

As already illustrated above, the output signal, emitted by the reference circuit 2 onto line 8a, is fed to the input of the signal relay circuit 3 via line 15.

Depending on whether the voltage of the output signal fed by the reference circuit 2 to lines 8a, 15 (and fed—via line 16—to the gates of the transistors 17a, 17b of the signal relay circuit 3) is higher or lower than a predetermined critical value, a "high logic" or a "low logic" output signal (voltage $U_a$) is emitted at the output of the signal relay circuit 3 (i.e. to lines 18c, 19), because—depending on whether the output signal of the reference circuit 2, fed to the gates of transistors 17a, 17b, is higher or lower than the predetermined critical value—either the n-channel MOSFET 17b is brought into a conductive state, and the p-channel MOSFET 17a into a blocked state, or—conversely—the n-channel MOSFET 17b is brought into a blocked state and the p-channel MOSFET 17a into a conductive state.

Thereby it is ensured that the output signal (voltage $U_a$) emitted at the output of the signal relay circuit 3 (and inverted in relation to the signal present at the input of the signal relay circuit 3) in every case "clearly" carries either a "high logic", or a "low logic" signal level (and not for instance—as may be the case with the output signal 2 emitted by the reference circuit 2—a level somewhere between a "high logic" and a "low logic" level).

Depending on whether a "high logic" or a "low logic" output signal (a "result" signal $U_a$) is emitted at the output of the signal relay circuit 3, the level of the voltage $U_e$ present at the first input of the reference circuit 2 is higher or lower than the level of the voltage $V_{interface,external}$ present at the (second) input of the reference circuit 2—at each measuring point $t_{1,0}$, $t_{1,1}$, $t_{1,2}$, $t_{1,3}$, $t_{1,4}$.

Figure 3:
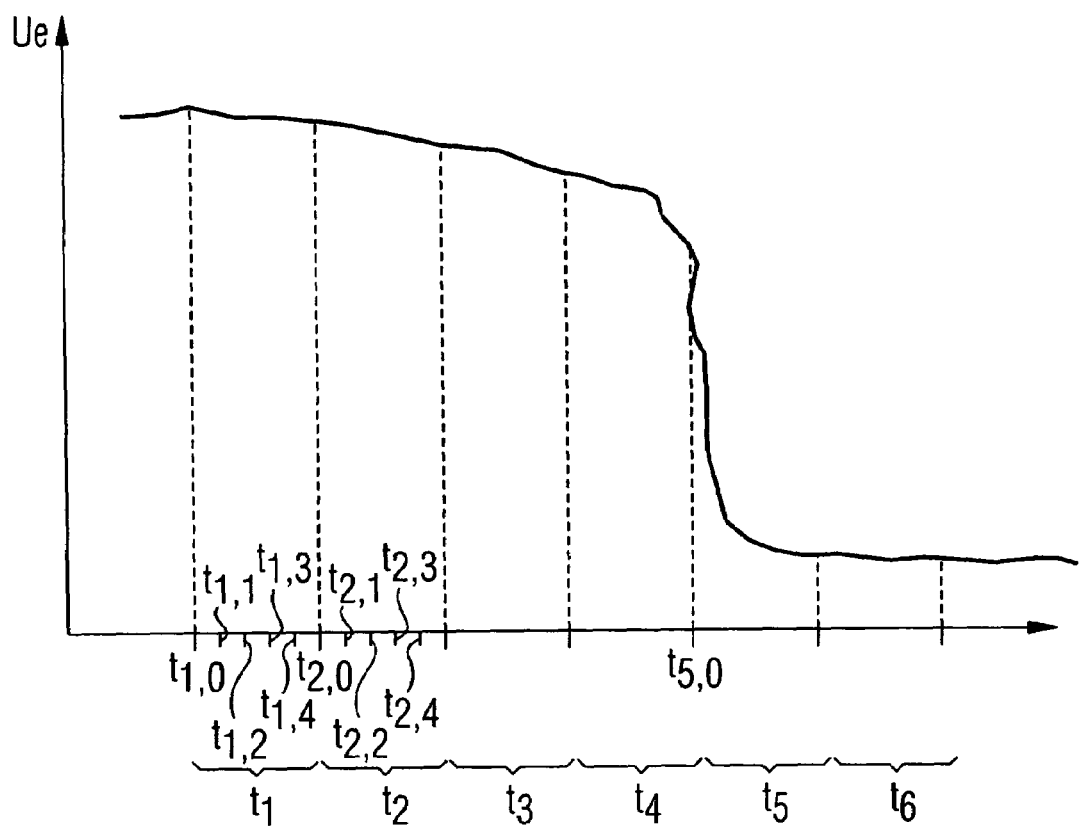
FIG. 3 shows a signal present at the semi-conductor component, the quality of which is to be tested with the signal test procedure according to the embodiment example of the invention, and/or with the switching device shown in FIG. 1, and with one of the test apparatuses shown in FIGS. 2a and 2b.

As illustrated in FIG. 3, the voltage $U_e$ remains essentially constant during the relatively brief (first) measuring interval t1 encompassing the above measuring points $t_{1,0}$, $t_{1,1}$, $t_{1,2}$, $t_{1,3}$, $t_{1,4}$.

A voltage $U_{e,ergebnis}$ may for instance therefore be regarded as an approximate "measurement result" for voltage $U_e$, which lies between those two voltages $V_{interface,external}$, in which the voltage $U_a$ has changed its state from "high logic" to "low logic" (or more correctly, a voltage $U_{e,ergebnis}$, lying between the lowest voltage $V_{interface,external}$ used, in which the voltage $U_a$ has (just) been "high logic" (or "low logic"), and the highest voltage $V_{interface,external}$ used, in which the voltage $U_a$ has (just) been "low logic" (or "high logic").

For instance when, at a voltage of $V_{interface,external}$ of 1.00 V (and also at higher voltages $V_{interface,external}$) the voltage $U_a$ was "high logic" (or "low logic") and at a voltage $V_{interface,external}$ of 0.75 V (and also at lower voltages $V_{interface,external}$) the voltage $U_a$ was "low logic" (or "high logic"), it may be assumed that the actual voltage $U_e$ lay between 0.75 V and 1.00 V, so that the voltage $U_{e,ergebnis}$=0.875 V, falling between them (or any other voltage falling between 0.75 V and 1.00 V) may for instance be considered as the "measurement result" for voltage $U_e$.

A measurement for voltage $U_e$, performed in similar fashion to the measurement described above, is then, as illustrated in FIG. 3, also performed for the measurement interval t2—following on the (first) measurement interval t1—(i.e. at particular, chronologically adjacent measurement points $t_{2,0}$, $t_{2,1}$, $t_{2,2}$, $t_{2,3}$, $t_{2,4}$—at voltages $V_{interface,external}$ changed in each case—the voltage $V_{interface,external}$ is compared with the voltage $U_e$), etc.

As is apparent from FIG. 3, the signal $U_e$—to be tested—can for instance be a digital (AC) signal, changing from a "high logic" (cf. the measurement intervals t1, t2, t3, t4) and—for instance from point $t_{5,0}$—to a "low logic" state (cf. the measurement interval t5, etc.), which signal has for instance been falsified and/or distorted by reflections, noise, etc.

By means of the procedure described above, the progress of the signal ($U_e$) present at the above connection of the semi-conductor components 103a, 103b, 103c can be precisely detected and/or measured, without the electrical characteristics of the semi-conductor component connection and thereby also the signal ($U_e$) to be measured and/or assessed being—additionally—distorted by the measurement.

The measurement results can—for instance as illustrated in FIG. 5—be visualized for instance on a display device, for instance a video screen 20, whereby every measurement result allocated to a particular measurement interval t1, t2 etc. is in each case displayed in superimposed (or juxtaposed) rows (especially for instance—depending on whether at a particular measurement point $t_{1,0}$, $t_{1,1}$, $t_{1,2}$, $t_{1,3}$, $t_{1,4}$, ... $t_{1,n}$, $t_{1,n+1}$, $t_{1,n+2}$ the voltage $U_a$ is "high logic" or "low logic"—a display element (or several similar elements) allocated to each measurement point $t_{1,0}$, $t_{1,1}$, $t_{1,2}$, $t_{1,3}$, $t_{1,4}$, ... $t_{1,n}$, $t_{1,n+1}$, $t_{1,n+2}$ is activated or deactivated (and/or for instance is made to light up "dimly" or "brightly" or to shine in various colors etc.)).

REFERENCE NUMBERS

1 Signal receiver circuit section
2 Reference circuit
3 Signal relay circuit
4a Line
4b Line
5a N-channel MOSFET
5b N-channel MOSFET
6 Current source device
7a Resistor
7b Resistor
8a Line
8b Line
9a Line
9b Line
10a Line
10b Line
10c Line
11a Line
11b Line
11c Line
12 DC current source device
13 Switching device
14a Line
14b Line
15 Line
16 Line
17a P-channel MOSFET
17b N-channel MOSFET
18a Line
18b Line
18c Line
18d Line
18e Line
19 Line
20 Video screen
102 Wafer
103a Semi-conductor component
103b Semi-conductor component
103c Semi-conductor component
103d Semi-conductor component
106 Test apparatus
107 Slicing machine
108 Test card
109a Contact pin
109b Contact pin
111a Carrier
111b Carrier
111c Carrier
111d Carrier
112a Component housing
112b Component housing
112c Component housing
112d Component housing
113 Electronic module
116 Test apparatus
118 Test card
119a Contact pin
119b Contact pin
126a Test apparatus
26b Test apparatus
126c Test apparatus
126d Test apparatus
129a Line
129b Line
129c Line
129d Line
136a Test apparatus
136b Test apparatus
136c Test apparatus
136d Test apparatus
139a Line
139b Line
139c Line
139d Line
146 Test apparatus
149 Line

What is claimed is:

1. A signal-test procedure for testing semi-conductor components, the signal test procedure, comprising:
   a) receiving a signal to be tested from an external connection of a semi-conductor component;

b) coupling a reference signal at a particular voltage level from a further external connection of the semi-conductor component to a comparison node;
c) performing a first comparison by comparing the signal with the reference signal;
d) changing the voltage level of the reference signal a first time to a second particular voltage level after the first comparison is performed;
e) performing a second comparison by comparing the signal with the reference signal at the second particular voltage level after changing the voltage level;
f) decoupling the reference signal from the comparison node, then coupling an internal reference signal to the comparison node; and
g) receiving a further signal at the external connection of the semi-conductor component;
h) performing a third comparison by comparing the internal reference signal with the further signal.

2. The procedure according to claim 1, further comprising:
i) after the second comparison is performed, changing the voltage level of the reference signal a second time to a voltage level that differs from the reference signal voltage level used in the first and second comparisons;
h) performing a third comparison by comparing the signal with the reference signal, after changing the voltage level a second time.

3. The procedure according to claim 1, wherein comparing the signal with the reference signal for the first and second comparisons comprises determining whether the voltage level of the reference signal is higher or lower than the voltage level of the signal.

4. The procedure according to claim 1, wherein a comparator circuit is used for comparing the signal with the reference signal for the first and second comparisons.

5. The procedure according to claim 4, wherein the further signal comprises an input signal such that, during normal operation of the semi-conductor component, the comparator circuit is used for evaluating input signals present at the external connection.

6. The procedure according to claim 1, wherein a reference result signal resulting from the first and second comparisons between the signal and the reference signal is made available.

7. The procedure according to claim 6, wherein the reference result signal is directly relayed to an additional connection of the semi-conductor component.

8. The procedure according to claim 6, wherein the reference result signal is not directly relayed to a connection of the semi-conductor component, instead the level of the reference result signal is indirectly determined via a signal emitted at the further external connection of the semi-conductor component in reaction to the signal.

9. The procedure according to claim 1, wherein the signal, of which the quality is to be tested, is a DC signal.

10. The procedure according to claim 1, wherein the signal, of which the quality is to be tested, is an AC signal.

11. The procedure according to claim 10, wherein a)-h) are performed while the voltage level of the AC signal remains essentially constant.

12. A test apparatus for detecting a shape of a signal over time, the test apparatus comprising:
a signal output device for emitting a signal, of which the quality is to be tested, to an external connection of a semi-conductor component;
a further signal output device for emitting a reference signal at a particular voltage level during a test mode, wherein the further signal output device is coupled to a reference connection of the semi-conductor component for comparing the signal with the reference signal in the semi-conductor component, and for emitting the reference signal at a changed voltage level in comparison to the reference signal initially emitted, to the reference connection of the semi-conductor component, for comparing the signal with the reference signal at the changed voltage level in the semi-conductor component, so as to detect the shape of the signal applied to the external connection; and
a switch comprising a first switch input coupled to the further signal output device, a second switch input coupled to an internal reference signal, and a switch output coupled to the reference connection of the semi-conductor component, wherein the first switch input is selected to be coupled to the switch output during the test mode, and wherein the second switch input is selected to be coupled to the switch output during a normal operation.

13. The procedure according to claim 1, wherein the external connection of the semiconductor component and the further external connection of the semi-conductor component each comprise a pad.

14. A signal-test procedure for detecting a shape of a signal over time, the signal test procedure comprising:
a) applying the signal to an external connection of a semiconductor component;
b) applying a reference signal at a first particular voltage level to a further external connection of the semiconductor component;
c) comparing the signal with the reference signal at the first particular voltage level for a first time;
d) changing the voltage level of the reference signal to a second particular voltage level for a first time after comparing the signal with the reference signal at the first particular voltage level for the first time;
e) comparing the signal with the reference signal at the second particular voltage level for a first time after changing the voltage level of the reference signal to the second particular voltage level for the first time;
f) changing the voltage level of the reference signal to the first particular voltage level for a second time after comparing the signal with the reference signal at the second particular voltage level for the first time;
g) comparing the signal with the reference signal at the first particular voltage level for a second time after changing the voltage level of the reference signal to the first particular voltage level for the second time;
h) changing the voltage level of the reference signal to the second particular voltage level for a second time after comparing the signal with the reference signal at the first particular voltage level for the second time;
i) comparing the signal with the reference signal at the second particular voltage level for a second time after changing the voltage level of the reference signal to the second particular voltage level for the second time, wherein the shape of the signal applied to the external connection is detected; and
j) switching the reference signal from the further external connection to a reference signal from an internal connection, wherein the semiconductor component operates in a normal mode.

15. A semiconductor circuit comprising:
a reference circuit comprising a first reference circuit input, a second reference circuit input, and a reference circuit output, the first reference circuit input coupled to a first test signal node; and a selection switch comprising a first switch input coupled to a second test signal node, a second switch input coupled to an internal reference signal node, and a switch output coupled to the second reference circuit input, wherein the first switch input is coupled to the switch output during a test mode, and wherein the second switch input is coupled to the switch output during a normal operation mode.

16. The semiconductor circuit of claim 15, wherein during the test mode, a voltage at the first test signal node is estimated by varying a voltage at the second test signal node and observing the reference circuit output each time the second test signal voltage is varied.

17. The semiconductor circuit of claim 15, wherein the reference circuit comprises:

a first transistor, wherein a gate of the first transistor is coupled to the first reference circuit input;

a second transistor, wherein a gate of the second transistor is coupled to the second reference circuit input; and a current source coupled to a source of the first transistor and a source of the second transistor.

18. The semiconductor circuit of claim 17, wherein the semiconductor circuit further comprises a signal relay circuit coupled to the reference circuit output.

19. The semiconductor circuit of claim 18, wherein the relay circuit outputs a logic level.

* * * * *